United States Patent
Fujita

(10) Patent No.: US 8,409,350 B2
(45) Date of Patent: Apr. 2, 2013

(54) GALLIUM NITRIDE CRYSTAL GROWTH METHOD, GALLIUM NITRIDE CRYSTAL SUBSTRATE, EPI-WAFER MANUFACTURING METHOD, AND EPI-WAFER

(75) Inventor: Shunsuke Fujita, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 426 days.

(21) Appl. No.: 12/179,587

(22) Filed: Jul. 25, 2008

(65) Prior Publication Data

US 2009/0026417 A1    Jan. 29, 2009

(30) Foreign Application Priority Data

Jul. 27, 2007  (JP) .................................. 2007-196318

(51) Int. Cl.
  *C30B 21/02* (2006.01)
(52) U.S. Cl. ................. 117/88; 117/89; 257/76; 438/72
(58) Field of Classification Search ...................... 117/88, 117/89; 257/76; 438/72
  See application file for complete search history.

(56) References Cited

U.S. PATENT DOCUMENTS

| | | | |
|---|---|---|---|
| 6,303,405 B1 * | 10/2001 | Yoshida et al. | 438/46 |
| 6,667,184 B2 * | 12/2003 | Motoki et al. | 438/22 |
| 6,734,530 B2 * | 5/2004 | Ban | 257/628 |
| 6,855,620 B2 * | 2/2005 | Koike et al. | 438/481 |
| 2003/0001238 A1 * | 1/2003 | Ban | 257/627 |
| 2004/0211355 A1 * | 10/2004 | Motoki et al. | 117/19 |
| 2005/0048685 A1 * | 3/2005 | Shibata | 438/46 |
| 2005/0098095 A1 * | 5/2005 | D'Evelyn et al. | 117/105 |
| 2005/0139960 A1 * | 6/2005 | Shibata | 257/615 |
| 2005/0274975 A1 * | 12/2005 | Shibata | 257/183 |
| 2007/0296061 A1 * | 12/2007 | Sasaki et al. | 257/615 |
| 2008/0308815 A1 * | 12/2008 | Kasai et al. | 257/76 |

FOREIGN PATENT DOCUMENTS

| | | |
|---|---|---|
| JP | H11-068156 A | 3/1999 |
| JP | 2004-006568 A | 1/2004 |
| JP | 2004-296640 A | 10/2004 |
| JP | 2005-251961 A | 9/2005 |
| JP | 2007-019052 A | 1/2007 |

* cited by examiner

*Primary Examiner* — Bob M Kunemund
(74) *Attorney, Agent, or Firm* — James W. Judge

(57) ABSTRACT

Affords gallium nitride crystal growth methods, gallium nitride crystal substrates, epi-wafers, and methods of manufacturing the epi-wafers, that make it possible to curb cracking that occurs during thickness reduction operations on the crystal, and to grow gallium nitride crystal having considerable thickness. A gallium nitride crystal growth method in one aspect of the present invention is a method of employing a carrier gas, a gallium nitride precursor, and a gas containing silicon as a dopant, and by hydride vapor phase epitaxy (HVPE) growing gallium nitride crystal onto an undersubstrate. The gallium nitride crystal growth method is characterized in that the carrier-gas dew point during the gallium nitride crystal growth is −60° C. or less.

8 Claims, 5 Drawing Sheets

GALLIUM NITRIDE CRYSTAL GROWTH METHOD, GALLIUM NITRIDE CRYSTAL SUBSTRATE, EPI-WAFER MANUFACTURING METHOD, AND EPI-WAFER

BACKGROUND OF THE INVENTION

1. Technical Field

The present invention relates to methods of growing gallium nitride crystal, to gallium nitride crystal substrates, to methods of manufacturing epi-wafers, and to epi-wafers.

2. Description of the Related Art

Gallium nitride (GaN) crystal is employed as substrates for light emitting diodes (LEDs), laser diodes (LDs), and like semiconductor devices. With gallium nitride crystal, which has an energy bandgap of 3.4 eV and high thermal conductivity, because an electrode can be provided on the crystal back side, the driving (operating) voltage of the semiconductor devices can be reduced.

Examples of methods of manufacturing such semiconductor devices include the following method set forth in Japanese Unexamined Pat. App. Pub. No. 2005-251961 (Patent Document 1). First, a seed-crystal layer composed of Group III-nitride crystal is deposited onto a first principal face of an undersubstrate by a deposition technique such as metalorganic chemical vapor deposition (MOCVD), molecular beam epitaxy (MBE), or hydride vapor phase epitaxy (HVPE). After that, III-nitride single crystal is grown onto the seed crystal by a liquid-phase growth technique and the undersubstrate is removed, whereby a III-nitride single crystal wafer is manufactured. Next, semiconductor devices are formed onto a first principal face of the III-nitride single crystal wafer. Then, with an objective such as improving the device's heat dissipation characteristics, the second principal face of the III-nitride single crystal wafer is subjected to a removing process by means of grinding, polishing, etc. to reduce the wafer thickness.

Furthermore, in Japanese Unexamined Pat. App. Pub. No. H11-68156 (Patent Document 2), for example, depositing a III-nitride semiconductor layer onto a substrate by MOCVD is disclosed. Patent Document 2 describes that in this growth, disilane ($Si_2H_6$) is employed, with as its carrier gas a refined hydrogen gas whose dew point has been brought to −90° C., to grow a 0.2 μm-thick n-type GaN layer doped with silicon (Si).

However, a problem with, as in Patent Document 1, performing a process for thickness reduction on the second principal face of III-nitride single crystal wafers has been that cracking occurs, with impurities incorporated into the crystal during growth being a causative factor.

Furthermore, in Patent Document 2, each layer is grown by MOCVD, which has been prohibitive of making the thickness of the deposited layers greater.

BRIEF SUMMARY OF THE INVENTION

Accordingly, an object of the present invention is to make available gallium nitride crystal growth methods, gallium nitride crystal substrates, epi-wafers, and epi-wafer manufacturing methods, whereby cracking that occurs in performing thickness-reducing operations can be curbed, and gallium nitride crystal having considerable thickness can be grown.

As a result of concerted research efforts, the present inventors discovered that in gallium nitride deposition implementations in which the crystal is grown by an HVPE technique suited to increasing the crystal thickness, and with silicon being the dopant, the factor responsible for cracking incidents originates in oxygen in the carrier gas. The reason is that because silicon has a propensity to be readily oxidized, with oxygen (O) being contained in the carrier gas, silicon reacts with the oxygen within the carrier gas into silicon dioxide ($SiO_2$) or other silicon oxides. If the silicon is taken into GaN crystal as silicon oxides, the silicon oxides turn out to be impurities that do not function as n-type impurities. As a consequence, the gallium nitride crystal becomes hardened and embrittled, which is believed to cause cracking to occur when the gallium nitride crystal is subjected to processes for thickness reduction.

The present inventors also found that oxygen in the carrier gas leading to occurrence of cracking is an issue peculiar to HVPE, and that with MOCVD this issue does not arise. The reason for this is that in gallium nitride crystal growth by MOCVD, organic metals are employed for the precursor gases. Oxygen in the carrier gas thus reacts with the carbon (C) in the organic metals before reacting with silicon, and is discharged as carbon monoxide (CO) or carbon dioxide ($CO_2$) outside the reaction furnace. Moreover, even should silicon oxides be taken into the crystal, cracking is unlikely to occur because the thickness of the gallium nitride crystal layer that is grown is at the level of a thin several μm. Accordingly, the foregoing Patent Document 2, in which crystal is grown by MOCVD, does not involve the issue of cracks arising in growing gallium nitride crystal with silicon being the dopant. Therefore, despite employing the low-dew-point carrier gas, Patent Document 2 does not involve effectiveness in keeping silicon oxide generation to a minimum.

As a result of intensive investigations the present inventors made, based on the above-described findings, to curb incidents of cracking in gallium nitride HVPE deposition implementations in which the crystal is grown with silicon being the dopant, they came to the realization that during gallium nitride crystal growth in HVPE situations, if the carrier gas has a dew point of −60° C. or less, incidents of the above-described cracking could be kept to a minimum. Accordingly, a method in one aspect of the present invention of growing gallium nitride crystal employs a carrier gas, a gallium nitride precursor, and a gas containing silicon as a dopant, and is a method of growing gallium nitride crystal onto an undersubstrate by hydride vapor phase epitaxy (HVPE). The gallium-nitride-crystal growth method is characterized in that the carrier-gas dew point during growth of the gallium nitride crystal is −60° C. or less.

According to a gallium nitride crystal growth method of the present invention, utilizing HVPE, with which growth speeds are faster compared with MOCVD, makes it possible to readily grow thick gallium nitride crystal. Furthermore, employing a carrier gas having a dew point of −60° C. or less sufficiently decreases moisture in the carrier gas to reduce oxygen in the carrier gas. This makes it possible to keep the generation of silicon oxide from the reaction between oxygen and silicon under control, to enable keeping to a minimum the incorporation of silicon as silicon oxides in the grown gallium nitride crystal. Hardening and embrittling of the grown gallium nitride crystal can therefore be curbed, which makes it possible to minimize incidents of cracking when the gallium nitride crystal undergoes thickness reduction.

Herein, "dew point" in the present invention means a measurement made by a chilled mirror dew point hygrometer.

In the above gallium nitride crystal growth method, it is preferable that the partial pressure of the carrier gas during the gallium nitride crystal growth is between 0.56 atm and 0.92 atm inclusive.

Having the carrier-gas partial pressure be at least 0.56 atm makes it possible to supply the gallium nitride precursor uniformly to the undersubstrate, and to restrain silicon from reacting into a silicon oxide due to oxygen contained in the source gas. On the other hand, having the carrier-gas partial pressure be no greater than 0.92 atm allows the gallium nitride precursor to be supplied to the undersubstrate adequately.

A gallium nitride crystal substrate of the present invention is obtained by the above-described gallium nitride crystal growth method. The gallium nitride crystal substrate is furnished with the undersubstrate, and with gallium nitride crystal formed onto the undersubstrate.

That is, a gallium nitride crystal substrate of the present invention is furnished with the undersubstrate and, formed onto the undersubstrate, with gallium nitride crystal in which incorporation of silicon as a silicon oxide has been restrained. Therefore, cracking that occurs in processing the gallium nitride crystal in order to reduce its thickness can be kept to a minimum. Moreover, gallium nitride crystal having considerable thickness can be obtained.

In an epi-wafer manufacturing method of the present invention, the following steps are carried out. Initially, gallium nitride crystal is grown onto an undersubstrate by the foregoing gallium nitride crystal growth method. Subsequently, at least the undersubstrate is removed to form a substrate constituted from the gallium nitride crystal. Then an epitaxially grown layer is formed onto the substrate. After that, in the substrate, the surface on the side opposite from the surface onto which the epitaxially grown layer has been formed is processed to reduce the substrate thickness.

According to the epi-wafer manufacturing method of the present invention, the substrate processed for thickness reduction is constituted from gallium nitride crystal in which incorporation of silicon as a silicon oxide has been kept to a minimum. Therefore, epi-wafers in which, in reducing the substrate thickness, incidents of cracking are curbed can be obtained.

An epi-wafer of the present invention is manufactured by, and is furnished with a substrate and with an epitaxially grown layer formed onto the substrate according to, the above-described epi-wafer manufacturing method.

According to an epi-wafer of the present invention, a substrate constituted by gallium nitride crystal in which the incorporation of silicon as a silicon oxide has been kept to a minimum is provided, which restrains incidents of cracking.

The gallium nitride crystal growth method, gallium nitride crystal substrate, epi-wafer manufacturing method, and epi-wafer of the present invention make it possible to curb cracking occurring when operations for thickness reduction are performed, and to grow gallium nitride crystal with considerable thickness, because the carrier gas employed in growing the gallium nitride crystal has a dew point of −60° C. or less.

From the following detailed description in conjunction with the accompanying drawings, the foregoing and other objects, features, aspects and advantages of the present invention will become readily apparent to those skilled in the art.

DETAILED DESCRIPTION OF THE INVENTION

Figure 1:
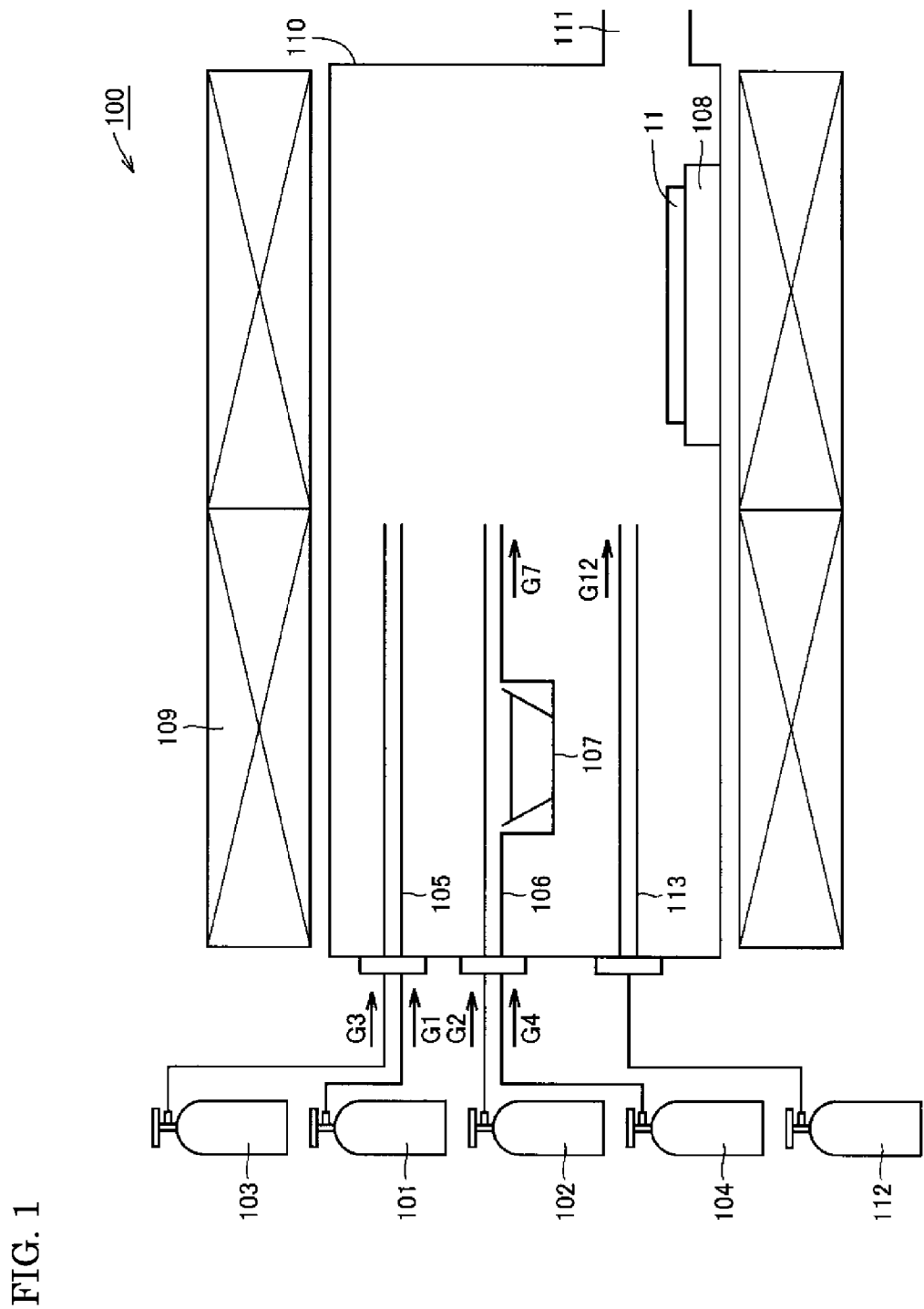
FIG. 1 is an outline diagram illustrating a HVPE reactor employed in a gallium nitride crystal growth method in Embodiment Mode 1 of the present invention.

Hereinafter, referring to the figures, embodiment modes of the present invention will be described. It should be understood that in the drawings accompanying the present description, identical or equivalent features are labeled with identical reference marks, and their explanation will not be repeated.

Embodiment Mode 1

A gallium nitride crystal growth method in one embodiment mode of the present invention will be explained. In the gallium nitride crystal growth method in this embodiment mode, carrier gases, gallium nitride precursors, and a gas containing silicon as a dopant are employed to grow gallium nitride crystal onto an undersubstrate by hydride vapor phase epitaxy (HVPE).

FIG. 1 is an outline diagram illustrating a HVPE reactor employed in the gallium nitride crystal growth method in the one embodiment mode of the present invention. First, referring to FIG. 1, a HVPE reactor 100 employed in the gallium nitride crystal growth method in this embodiment mode will be explained. As illustrated in FIG. 1, the HVPE reactor 100 is provided with a first source-gas cylinder 101, second source-gas cylinder 102, first-carrier-gas cylinder 103, second-carrier-gas cylinder 104, first gas introducing line 105, second gas introducing line 106, source boat 107, susceptor 108, heater 109, crystal-growth vessel 110, exhaust-gas line 111, (not-illustrated) locally heating mechanism, doping-gas cylinder 112, and doping-gas introducing line 113. The HVPE reactor 100 is the horizontal reactor, for example.

The crystal growth vessel 110 is the vessel for, with an undersubstrate 11 being supported in the vessel interior, growing gallium nitride crystal onto the undersubstrate 11. The first source-gas cylinder 101, second source-gas cylinder 102, and source boat 107 are supplied respectively with precursors containing elements constituting the gallium nitride crystal that is grown. The doping-gas cylinder 112 is filled with a gas containing silicon as a dopant. The first gas introducing line 105, second gas introducing line 106, and doping-gas introducing line 113 are each arranged in the crystal-growth vessel 110 in order to introduce each of a first and second source gases G1 and G2, first and second carrier gases G3 and G4, and doping gas G12 from the outside of, to the inside of, the crystal growth vessel 110. The source boat 107, which holds a metal source of gallium nitride, is disposed in the under part of the second gas introducing line 106. In the source boat 107, the second source gas G2 supplied through the second gas introducing line 106 and the metal source are reacted with each other to form a reaction gas G7. The first gas introducing line 105, second gas introducing line 106, and doping-gas introducing line 113 are configured so that the reaction gas G7, first source gas G1, and doping gas G12 can be supplied to the surface of the undersubstrate 11.

The susceptor 108 supports the undersubstrate 11. The susceptor 108 is disposed so that within the crystal-growth vessel 110, that surface of the susceptor 108 on which the undersubstrate 11 is supported is positioned under the first and second gas introducing lines 105 and 106, and doping-gas introducing line 113. The susceptor 108 is horizontally disposed inside the crystal-growth vessel 110. Furthermore, the locally heating mechanism is the heating member such as a resistive heater for the undersubstrate 11, and is embedded in, for example, the susceptor 108.

The heater 109 has the power to globally heat the interior of the crystal-growth vessel 110 to, for example, between 700° C. and 1,500° C. inclusive, and is disposed outside the crystal growth vessel 110. The exhaust-gas line 111 is provided to the crystal-growth vessel 110 in order to exhaust a gas after the reaction to the outside of the crystal growth vessel 110.

It should be understood that the HVPE reactor 100 illustrated in FIG. 1 is configured so that the carrier gases in the first and second carrier-gas cylinders 103 and 104 are supplied respectively via the first and second gas introducing lines 105 and 106 to the inside of the crystal growth vessel 110, but the HVPE reactor 100 is not particularly limited to such a configuration. For example, one carrier-gas cylinder may be prepared to provide the crystal growth vessel 110 with a feed port for a carrier gas in the cylinder, in addition to the first and second gas introducing lines 105 and 106. In this example, the HVPE reactor 100 is configured so that supplying the carrier gas from the feed port to the undersubstrate 11 enables transporting the first source gas G1, second source gas G2, reaction gas G7, and doping gas to the undersubstrate 11. Moreover, although the doping-gas cylinder 112 is disposed for the doping-gas introducing line 113, the configuration in which a doping gas and carrier gas are supplied may be adopted.

Figure 2:
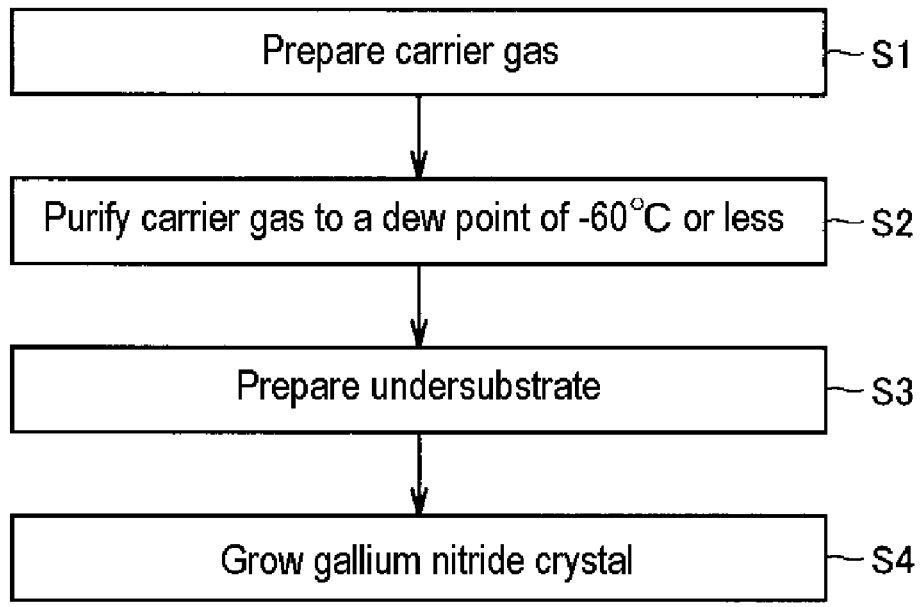
FIG. 2 is a flow chart representing the gallium nitride crystal growth method in Embodiment Mode 1 of the present invention.

FIG. 2 is a flow chart representing the gallium nitride crystal growth method in Embodiment Mode 1 of the present invention. To continue, referring to FIG. 2, the gallium nitride crystal growth method in this embodiment mode will be explained.

As illustrated in FIG. 1, carrier gases are prepared (Step 1), first. The carrier gases are the gases for transporting source gases to the undersubstrate 11. The carrier gases are not particularly limited, but they are the gases having a low reactivity with the source gases. Examples of the carrier gases include a hydrogen ($H_2$) gas, nitrogen ($N_2$) gas, argon (Ar) gas and other inert gases. Such kinds of commercially available gas are prepared, for example, as carrier gases.

Next, purification is carried out so that the prepared carrier gases have a dew point of −60° C. or less (Step 2). The prepared carrier gases are transported across a molecular film or absorbent to remove moisture as an impurity. In this manner, purification is carried out to bring dew point of the prepared carrier gases to −60° C. or less.

Dew point of the carrier gases is −60° C. or less, and preferably is −80° C. or less, with −90° C. or less being more preferable. Lowering the dew point to −60° C. or less prevents the generation of a silicon oxide formed from the reaction of silicon as a dopant with oxygen in the carrier gases. Bringing the dew point to −80° C. or less further prevents the reaction of silicon into a silicon oxide. Making the dew point −90° C. or less still further prevents the reaction of silicon into a silicon oxide. Form the perspective of being able to realize purification, the dew point of the carrier gases should be not less than, for example, −100° C.

In the carrier gas purification in this embodiment mode, the dew point of the carrier gases is controlled with a chilled-mirror dew-point hygrometer so as to be −60° C. or less. It should be understood that cooled mirror means the method of arranging a small mirror in a carrier-gas flowpath, and of raising or lowering the mirror temperature to monitor whether or not the mirror is fogged. If the mirror starts to be fogged when the mirror temperature reaches −60° C., carrier-gas dew point is determined to reach −60° C. Herein, with carrier-gas dew point being −60° C., moisture contained in carrier gas is 0.0011%.

Next, an undersubstrate 11 is prepared (Step 3). The undersubstrate 11 is the substrate for growing gallium nitride crystal onto it. The undersubstrate 11 is constituted of, for example, silicon, sapphire, silicon carbide, gallium nitride, or aluminum nitride. In order to grow gallium nitride crystal of satisfactory crystallinity and in which there is no difference between lattice constants, the undersubstrate 11 is preferably constituted of gallium nitride.

Subsequently, carrier gases having a dew point of −60° C. or less, gallium nitride precursors, and a gas containing silicon as a dopant are employed to grow gallium nitride crystal onto the undersubstrate 11 by HVPE (Step 4).

Specifically, as illustrated in FIG. 1, the first source-gas cylinder 101 and second source-gas cylinder 102 filled respectively with a first source gas and second source gas are prepared, first. Furthermore, a metal source is supplied to the source boat 107. The first and second source gases and metal source are the precursors of the gallium nitride crystal that is grown. For example, the following may be utilized; as the first source gas, an ammonia ($NH_3$) gas; as the second source gas, a hydrogen chloride (HCl) gas; and as the metal source supplied to the source boat 107, gallium (Ga).

Moreover, the doping-gas cylinder 112 the inside of which is filled with a doping gas containing silicon is prepared. As the silicon-containing doping gas, silane ($SiH_4$), disilane ($Si_2H_6$), chlorosilane ($SiHCl_3$), dichlorosilane ($SiH_2Cl_2$), monochlorosilane ($SiH_3Cl$), or tetrachlorosilane ($SiCl_4$) or other silane compounds may be utilized. The first and second source gases G1 and G2 as source gases and a doping gas G12 preferably have a lower dew point.

After that, the source boat 107 is heated. And, the second source gas G2 supplied through the second gas introducing line 106 and the metal source in the source boat 107 are reacted with each other to form a reaction gas G7. With the first and second carrier gases G3 and G4, the first source gas G1 supplied through the first gas introducing line 105, reaction gas G7, and doping gas G12 are flowed (supplied) so as to strike against the surface of the undersubstrate 11 to react them.

In this reaction, the interior of the HVPE reactor 100 is heated with the heater 109 to a temperature (for example, between 700° C. and 1,500° C. inclusive) at which gallium nitride crystal grows at an appropriate rate. Additionally, a gas after the reaction is exhausted via the exhaust-gas line 111 to the outside.

Herein, partial pressure of the carrier gases (in this embodiment mode, the total of partial pressures of the first and second carrier gases G3 and G4) in the gallium nitride crystal growth is preferably between 0.56 atm and 0.92 atm inclusive, and more preferably is between 0.67 atm and 0.89 atm inclusive. Bringing the partial pressure of the carrier gases to 0.56 atm or more enables supplying the gallium nitride precursors (in this embodiment mode, the first source gas G1 and reaction gas G7) uniformly to the undersubstrate 11. Furthermore, doing so makes it possible to keep under control the reaction of silicon into a silicon oxide, caused by oxygen contained in the source gas. Raising the partial pressure of the carrier gases to 0.67 atm or more enables supplying the gallium nitride precursors more uniformly to the undersubstrate 11, and enables further keeping under control the reaction of silicon in the doping gas into a silicon oxide. On the other hand, making the partial pressure 0.92 atm or less enables supplying the source gas sufficiently to the undersubstrate 11. Lowering the partial pressure to 0.89 atm or less makes it possible to supply the source gas more sufficiently to the undersubstrate 11. It should be understood that the amount (total pressure) of the partial pressures of the carrier gases and source gas is 1 atm.

Adjusting the flow rate of the first source gas G1, the flow rate of the second source gas G2, or the amount of the metal source in the source boat 107 enables varying, as appropriate, thickness of the gallium nitride crystal that is grown. The gallium nitride crystal is preferably grown so as to have a thickness of 200 μm or more. In HVPE, because crystal-growth rate is fast, controlling growth time permits growth of crystal having considerable thickness. Increasing the crystal thickness to 200 μm or more makes it possible to readily obtain gallium nitride crystals that can be employed alone as substrates for various semiconductor devices.

Figure 3:
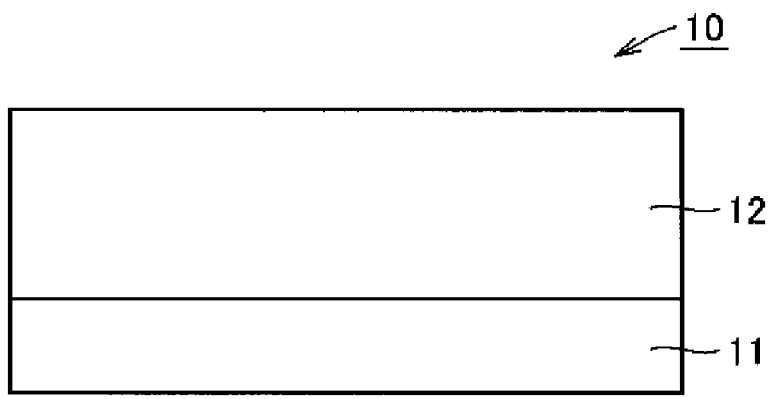
FIG. 3 is an outline diagram illustrating a gallium nitride crystal substrate in Embodiment Mode 1 of the present invention.

FIG. 3 is an outline diagram illustrating gallium nitride crystal substrate in Embodiment Mode 1 of the present invention. As illustrated in FIG. 3, carrying out the gallium nitride crystal growth method described above leads to gallium nitride crystal substrate 10 provided with an undersubstrate 11, and with gallium nitride crystal 12 formed onto the undersubstrate 11 and in which silicon has been incorporated as a dopant.

As described above, the gallium nitride crystal growth method in this embodiment mode is the method of growing the gallium nitride crystal 12—that is, the method of employing carrier gases, gallium nitride precursors, a gas containing silicon as a dopant to grow the gallium nitride crystal 12 onto the undersubstrate 11 by HVPE. And, the gallium nitride crystal growth method is characterized in that dew point of the carrier gases during the growth of the gallium nitride crystal 12 is –60° C. or less.

According to the GaN crystal growing method of the present invention, employing HVPE, in which growth rate is faster compared with that in MOCVD, makes it possible to readily grow a thick gallium nitride crystal 12. Furthermore, using a carrier gas having a dew point of –60° C. or less sufficiently decreases moisture in the carrier gas to reduce oxygen in the carrier gas. As a result, incorporation as a silicon oxide, of silicon as a dopant in the grown gallium nitride crystal 12 can be kept to a minimum. For this reason, the grown gallium nitride crystal 12 is made unlikely to harden and embrittle, and thus occurrence of cracking can be curbed when the gallium nitride thickness is reduced.

Herein, a silicon oxide formed from the reaction of silicon with oxygen has a function as a mask. Therefore, if incorporation of a silicon oxide in gallium nitride crystal can be controlled to a minimum, prevention of gallium nitride crystal growth by a silicon oxide having the mask function can be curbed. Therefore, according to the gallium nitride crystal growth method in this embodiment mode, gallium nitride crystal 12 having more preferable crystallinity and greater thickness can be grown.

Furthermore, the fact that the incorporation of an insulating silicon oxide can be controlled to a minimum leads to enhancement of conductivity of the obtained gallium nitride crystal 12. In particular, carrying out the process for thickness reduction (that is, the process for thickness reduction, such as polishing or grinding of a first principal face of the substrate in which at least the undersubstrate 11 is removed from the gallium nitride crystal substrate 10) enables curbing exposure of the silicon oxide on the substrate surface. As a result, in implementations in which an electrode is formed onto the surface, degradation in contact between the electrode and the GaN crystal can be minimized, and thus if the electrode is utilized as a semiconductor device, elevation in the operating voltage can be reduced.

Furthermore, because silicon as a dopant is incorporated in the gallium nitride crystal 12 without reacting with oxygen in carrier gas, the silicon is efficiently doped into the gallium nitride crystal 12. Therefore, gallium nitride crystal 12 that improves carrier concentration can be obtained.

Embodiment Mode 2

Figure 4:
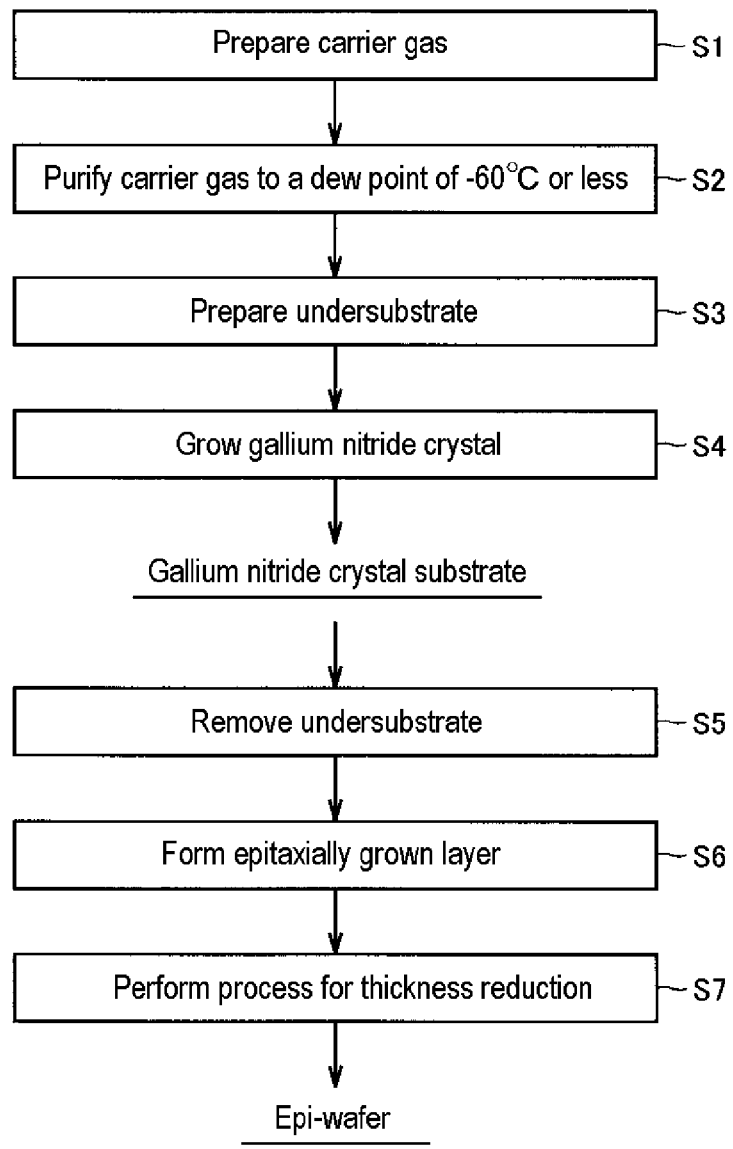
FIG. 4 is a flow chart representing an epi-wafer manufacturing method in Embodiment Mode 2.
Figure 5:
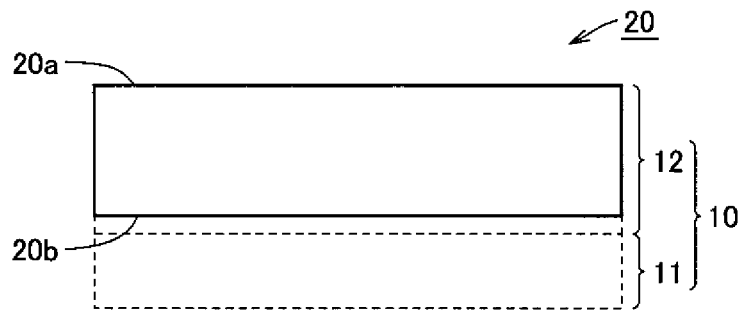
FIG. 5 is a schematic diagram illustrating a substrate in Embodiment Mode 2.
Figure 6:
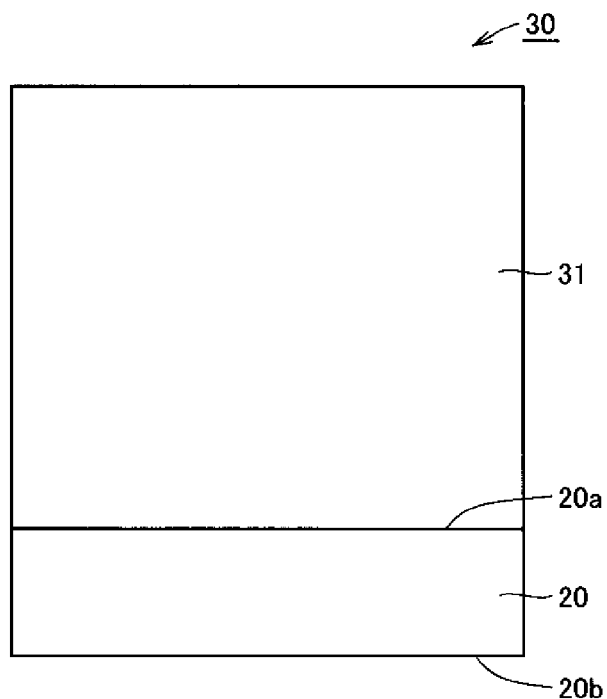
FIG. 6 is a schematic diagram illustrating an epi-wafer in Embodiment Mode 2.

FIG. 4 is a flow chart representing an epi-wafer manufacturing method in Embodiment Mode 2. FIG. 5 is a schematic diagram illustrating a substrate in Embodiment Mode 2. FIG. 6 is a schematic diagram illustrating an epi-wafer in Embodiment Mode 2. Referring to FIGS. 4 through 6, an epi-wafer manufacturing method in this embodiment mode will be explained.

First, gallium nitride crystal 12 is grown onto an undersubstrate 11 by the gallium nitride crystal growth method in Embodiment Mode 1 (S1 to S4). As a result, gallium nitride crystal substrate 10 as illustrated in FIG. 3 is obtained.

Next, as represented and illustrated in FIGS. 4 and 5, at least the undersubstrate 11 is removed from the gallium nitride crystal substrate 10 to form a substrate 20 consisting of the gallium nitride crystal 12 (Step S5). In the proximity of the interface between gallium nitride crystal 12 and undersubstrate 11, crystallinity is often unfavorable. Therefore, the region in the gallium nitride crystal 12 where crystallinity is unfavorable is in addition preferably removed from the gallium nitride crystal substrate 10. As a result, the substrate 20 having principal faces 20a and 20b is produced.

Examples of the removal methods include cutting and grinding. It should be understood that cutting means mechanical dividing (slicing off) of at least the undersubstrate 11 from the gallium nitride crystal substrate 10 with an electrodeposited diamond-wheel outer-circumferentially bladed slicer or wire saw. Grinding means that at least the undersubstrate 11 is mechanically scraped off with, for example, a grinding apparatus having diamond grinding wheel.

Which face is removed from the gallium nitride crystal substrate 10 is not limited to a face paralleling the surface of the gallium nitride crystal 12 described above, so for example, a face having any inclination with respect to the surface may be sliced.

Moreover, the principal faces 20a and 20b of the substrate 20 may be subjected to, for example, polishing in addition. The polishing methods are not particularly limited, so any method can be adopted.

Next, as illustrated in FIG. 6, an epitaxially grown layer 31 is formed onto the substrate 20 (Step S6). In this embodiment mode, the epitaxially grown layer 31 is formed onto the one principal face 20a of the substrate 20. In the epitaxially grown layer 31, a carrier gas having a dew point of –60° C. or less is preferably employed to epitaxially grow it onto the substrate 20. Furthermore, the epitaxially grown layer 31 is preferably grown epitaxially by HVPE to form it. It should be understood that the epitaxially grown layer 31 may be a plurality of layers.

Subsequently, in the substrate 20, the principal face 20b on the side opposite from the principal face 20a onto which the epitaxially grown layer 31 is formed is processed for thickness reduction (Step S7). As a method of the process for thickness reduction, cutting, grinding or other methods may be employed. Explanation of the processing method will not be repeated because the method is the same as that employed when at least the undersubstrate 11 is removed (Step S6).

As just described, carrying out the epi-wafer manufacturing method enables manufacturing an epi-wafer 30 provided with a substrate 20, and with an epitaxially grown layer 31 formed onto the substrate 20, as illustrated in FIG. 6. Additionally forming, for example, an electrode makes the epi-wafer 30 manufactured in this manner utilizable to semiconductor devices.

The method of manufacturing the epi-wafer 30 in this embodiment mode is provided with a step of processing for thickness reduction the principal face 20b on the side opposite from the principal face 20a onto which the epitaxially grown layer 31 is formed, in the substrate 20, as described above.

According to the method of manufacturing the epi-wafer 30 in this embodiment mode, when the principal face 20b is processed in order to reduce thickness of the substrate 20, the fact that incorporation of silicon as a silicon oxide is kept to a minimum makes the substrate 20 unlikely to harden and embrittle. Therefore, epi-wafers in which occurrence of cracking is curbed when a principal face 20b is processed can be manufactured.

Furthermore, exposure of oxidized silicon on the principal face 20b, caused by the process for reducing thickness of the substrate 20 can be kept under control, and thus contacting in the formation of an electrode onto the principal face 20b can be prevented from being deteriorated. Moreover, degradation of conductivity of applying voltage can be prevented, which keeps a rise in operating voltage to a minimum.

Embodiments

In the present embodiments, effects of employing a carrier gas having a dew point of −60° C. or less to grow gallium nitride crystal were investigated. Specifically, epi-wafers of Embodiments 1 through 15 and of Comparative Examples 1 through 3 were each produced to measure in the epi-wafers incidence of cracking, and the extent to which operating voltage rose.

Embodiments 1 through 15

In Embodiments 1 through 15, epi-wafers were produced in accordance with the epi-wafer manufacturing method in Embodiment Mode 2 of the present invention. More precisely, carrier gases of the kinds shown in Table I were each prepared (Step S1), first. Next, purification was carried out so that the prepared carrier gases have the dew points shown in Table I (Step S2). The prepared carrier gases were transported across a molecular film so as to have the dew points in Table I.

Next, 2-inch diameter sapphire undersubstrates were prepared (Step S3). Onto the (0001) plane of the undersubstrates, a mask composed of $SiO_2$ was formed by photolithography in the form of stripes along the <1-100> directions. The mask width was made 5 μm, with intervals between the adjacent striped masks being 5 μm.

Subsequently, employing: the carrier gases having a dew point of −60° C. or less; as gallium nitride precursors, a hydrogen chloride gas, an ammonia gas, and gallium; and as a gas containing silicon as a dopant, dichlorosilane, gallium nitride crystal was grown onto the undersubstrates by HVPE with the HVPE reactor illustrated in FIG. 1 (Step S4).

Specifically, the ammonia gas was prepared as the first source gas G1, and the hydrogen chloride gas was prepared as the second source gas G2. Subsequently, the gallium was supplied to the source boat 107, and the source boat 107 was heated. Then, the hydrogen chloride gas supplied through the second gas introducing line 106 and the gallium in the source boat 107 were reacted with each other as $Ga+HCl \rightarrow GaCl+\frac{1}{2}H_2$ to form a gallium chloride (GaCl) gas as the reaction gas G7.

Figure 7:
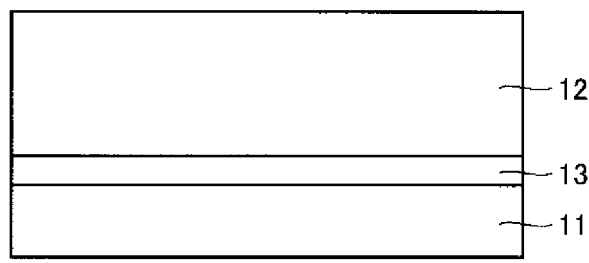
FIG. 7 is a schematic diagram illustrating a gallium nitride crystal substrate in the embodiments.

Also, the ammonia gas supplied through the first gas introducing line 105, and the gallium chloride gas were flowed so as to strike against that surface of the undersubstrates 11 onto which the gallium nitride crystal was grown, to cause a reaction as $GaCl+NH_3 \rightarrow GaN+HCl+H_2$ on the surface. As illustrated in FIG. 7, a 30 mm-thick buffer layer composed of gallium nitride was deposited onto the undersubstrates 11. Herein, FIG. 7 is a schematic diagram illustrating gallium nitride crystal substrate in the embodiments.

In order to deposit the buffer layer, partial pressures of the carrier-gases, HCl gas, and ammonia gas were brought respectively to 0.899 atm, to 0.001 atm, and 0.1 atm. The interior of the crystal-growth vessel 110 was heated with the heater 109 so as to be 500° C. The time required to grow a buffer layer 13 was made 0.5 hours.

After that, the partial pressures of the carrier gases, hydrogen chloride gas, and ammonia gas were each brought to the partial pressures shown in Table I to supply each of the gases to the undersubstrates 11. Furthermore, the interior of the crystal-growth vessel 110 was heated with the heater 109 so as to be 1,050° C. The time required to grow gallium nitride crystal 12 was made 80 hours. As a result, gallium nitride crystals 12 having the thicknesses shown in Table I were grown onto buffer layers 13. In this manner, gallium nitride crystal substrates, as illustrated in FIG. 7, provided with an undersubstrate 11, with a buffer layer 13 deposited onto the undersubstrate 11, and with gallium nitride crystal 12 grown onto the buffer layer 13 were produced.

Herein, as to the gallium nitride crystals 12 of the produced gallium nitride crystal substrates, carrier concentration and dislocation density were measured. The results are set forth in Table II. The carrier (silicon) concentration was measured with a Hall measurement device. The dislocation density was measured by the following method. The surfaces of the gallium nitride crystals 12 were etched with a molten potassium hydrate-sodium hydrate (KOH—NaOH) mixture at temperature of 350 degrees C. On the etched surfaces, etch pits formed at the positions corresponding to dislocations, and the number of the etch pits was counted to evaluate the dislocation density.

Next, the undersubstrates 11 and buffer layers 13 were removed by polishing from the produced gallium nitride crystal substrates to form substrates constituted of gallium nitride crystal 12 (step S5).

Herein, incidence of cracking that occurred when the substrates constituted of gallium nitride crystal 12 were formed was measured. The results are set forth in Table II. The incidence of cracking was measured by the method in which cracking was observed under 20-power objective lens of a differential interference optical microscope, and if 30 or more lines of cracks having a length of 100 μm or more were found on the entire surface of a 2 inch-diameter substrate, except for on the substrate peripheral edge of 5 mm, it was determined that cracking occurred in the substrate. The ratio of the number of the substrates on which cracking occurred to the number of samples was defined as the incidence of cracking.

Subsequently, the following layers were formed successively onto the substrates by MOCVD: a 5 μm-thick n-type GaN layer; a 3 nm-thick $In_{0.2}Ga_{0.8}N$ layer; a 60 nm-thick $Al_{0.2}Ga_{0.8}N$ layer; and a 150 nm-thick p-type GaN layer.

Next, in the substrates, the surface on the side opposite from the surface onto which an epitaxially grown layer was deposited was processed for thickness reduction (Step S7). In the present embodiments, as a process for thickness reduction, the surface on the p-type GaN layer was attached to a holder for polishing, and then polishing was performed with slurry containing SiC abrasives of 30 μm average powder diameter until thickness of the substrates was made 100 μm. In this manner, epi-wafers provided with a substrate constituted of gallium nitride crystal, and with an n-type GaN layer, $In_{0.2}Ga_{0.8}N$ layer, $Al_{0.2}Ga_{0.8}N$ layer, and p-type GaN layer, that were formed onto the substrate as an epitaxially grown layer.

Herein, as to the epi-wafers after the process for thickness reduction, incidence of cracking was measured. The results are set forth in Table II. The incidences of cracking, shown in Table II mean the total of incidence of cracking caused by the removal of the undersubstrates 11 and buffer layers 13, and of incidence of cracking after the process for thickness reduction. Furthermore, the incidence of cracking after the process for thickness reduction was measured in the same manner as in the measurement of the incidence of cracking caused by the removal of the undersubstrates 11 and buffer layers 13.

Next, in the substrates, onto the surface on the side opposite from the surface on which an epitaxially grown layer was formed, a 100 nm-thick n-type electrode in which gold and nickel were deposited was formed. Additionally, onto the epitaxially grown layer (p-type GaN layer), a 100 nm-thick p-type electrode was formed. In this manner, semiconductor devices in Embodiments 1 through 15 were produced.

Herein, in the produced semiconductor devices in Embodiments 1 through 15, an operating voltage and that after 50 hours had passed at temperature of 100° C. were measured. A value obtained by subtracting the former operating voltage from the operating voltage after 50 hours was defined as an extent ($\Delta V_{op}$) to which operating voltage rose. The results are set forth in Table II.

COMPARATIVE EXAMPLES 1 THROUGH 3

Epi-wafers in Comparative Examples 1 through 3 basically have the same configuration as in the epi-wafer manufacturing method in Embodiments 1 through 15, but differ in that carrier-gas dew point is higher than that in Embodiments 1 through 15.

Specifically, in the epi-wafers in Comparative Examples 1 through 3, carrier gases of the kinds and dew points shown in Table I were prepared. Next, the same undersubstrates as in Embodiments 1 through 15 were prepared, and buffer layers were deposited under the same conditions as in Embodiments 1 through 15, apart from employing the carrier gases having the dew points shown in Table I. Subsequently, with the carrier gases having a dew point of more than −60° C., a hydrogen chloride gas, and an ammonia gas being at the partial pressures set forth in Table I, gallium nitride crystals each of which was doped with silicon were grown. As a result, gallium nitride crystal substrates provided with gallium nitride crystal, in Comparative Examples 1 through 3 were produced.

Next, as in Embodiments 1 through 15, the undersubstrates and buffer layers were removed to produce substrates. After that, as in Embodiments 1 through 15, an epitaxially grown layer was deposited onto the substrates. Subsequently, as in Embodiments 1 through 15, in the substrates, the surface on the side opposite from the surface on which the epitaxially grown layer was formed was processed for thickness reduction. In this manner, the epi-wafers in Comparative Examples 1 through 3 were produced.

Next, as in Embodiments 1 through 15, an n-type and p-type electrodes were formed to produce semiconductor devices in Comparative Examples 1 through 3.

Also in Comparative Examples 1 through 3, the following were measured as in Embodiments 1 through 15: in the gallium nitride crystals, the incidence of cracking, carrier concentration, and dislocation density; in the epi-wafers, the incidence of cracking; and in the semiconductor devices, the extent to which operating voltage rose. The results are set forth in Table II.

REFERENCE EXAMPLES 1 THROUGH 3

Epi-wafers in Reference Examples 1 through 3 basically have the same configuration as in the epi-wafer manufacturing method in Embodiments 1 through 15, but differ in that oxygen was used without utilizing silicon as a dopant, and in that carrier-gas dew point is higher.

Specifically, in the epi-wafers in Reference Examples 1 through 3, carrier gases of the kinds and dew points shown in Table I were prepared. Next, the same undersubstrates as in Embodiments 1 through 15 were prepared, and buffer layers were deposited under the same conditions as in Embodiments 1 through 15, apart from employing the carrier gases having the dew points set forth in Table I, and from utilizing an oxygen gas as a doping gas. Subsequently, with the carrier gases having a dew point of more than −60° C., an HCl gas, and an ammonia gas being at the partial pressures shown in Table I, gallium nitride crystals each of which was doped with oxygen were grown. As a result, gallium nitride crystal substrates provided with gallium nitride crystal, in Reference Examples 1 through 3 were produced.

Next, as in Embodiments 1 through 15, the undersubstrates and buffer layers were removed to yield substrates. After that, as in Embodiments 1 through 15, an epitaxially grown layer was deposited onto the substrates. Subsequently, as in Embodiments 1 through 15, in the substrates, the surface on the side opposite from the surface on which the epitaxially grown layer was formed was processed for thickness reduction. In this manner, the epi-wafers in Reference Examples 1 through 3 were produced.

Next, as in Embodiments 1 through 15, an n-type and p-type electrodes were formed to produce semiconductor devices in Reference Examples 1 through 3.

Also in Reference Examples 1 through 3, the following were measured as in Embodiments 1 through 15: in the gallium nitride crystals, the incidence of cracking, carrier concentration, and dislocation density; in the epi-wafers, the incidence of cracking; and in the semiconductor devices, the extent to which operating voltage rose. The results are set forth in Table II.

TABLE I

| | Carrier gas preparation | | Partial pressure during GaN crystal growth (atm) | | | GaN crystal |
|---|---|---|---|---|---|---|
| | Type | Dew pt. (° C.) | Carrier gas | HCl | $NH_3$ | thickness (mm) |
| Embod. 1 | $N_2$ | −60 | 0.89 | 0.01 | 0.10 | 8 |
| Embod. 2 | $N_2$ | −70 | 0.89 | 0.01 | 0.10 | 8 |

TABLE I-continued

| | Carrier gas preparation | | Partial pressure during GaN crystal growth (atm) | | | GaN crystal thickness (mm) |
|---|---|---|---|---|---|---|
| | Type | Dew pt. (° C.) | Carrier gas | HCl | $NH_3$ | |
| Embod. 3 | $N_2$ | −80 | 0.89 | 0.01 | 0.10 | 8 |
| Embod. 4 | $N_2$ | −90 | 0.89 | 0.01 | 0.10 | 8 |
| Embod. 5 | $H_2$ | −60 | 0.89 | 0.01 | 0.10 | 8 |
| Embod. 6 | $H_2$ | −70 | 0.89 | 0.01 | 0.10 | 8 |
| Embod. 7 | $H_2$ | −80 | 0.89 | 0.01 | 0.10 | 8 |
| Embod. 8 | $H_2$ | −90 | 0.89 | 0.01 | 0.10 | 8 |
| Embod. 9 | $N_2$ | −80 | 0.92 | 0.01 | 0.07 | 4 |
| Embod. 10 | $N_2$ | −80 | 0.75 | 0.02 | 0.23 | 4 |
| Embod. 11 | $N_2$ | −80 | 0.82 | 0.02 | 0.16 | 4 |
| Embod. 12 | $N_2$ | −80 | 0.67 | 0.03 | 0.30 | 10 |
| Embod. 13 | $N_2$ | −80 | 0.56 | 0.04 | 0.40 | 15 |
| Embod. 14 | $H_2:N_2 = 1:1$ | −80 | 0.56 | 0.04 | 0.40 | 8 |
| Embod. 15 | Ar | −80 | 0.56 | 0.04 | 0.40 | 8 |
| Comp. Ex. 1 | $N_2$ | 0 | 0.78 | 0.02 | 0.20 | 8 |
| Comp. Ex. 2 | $N_2$ | −20 | 0.78 | 0.02 | 0.20 | 8 |
| Comp. Ex. 3 | $N_2$ | −50 | 0.78 | 0.02 | 0.20 | 8 |
| Ref. Ex. 1 | $N_2$ | 0 | 0.89 | 0.01 | 0.10 | 8 |
| Ref. Ex. 2 | $N_2$ | −20 | 0.89 | 0.01 | 0.10 | 8 |
| Ref. Ex. 3 | $N_2$ | −50 | 0.89 | 0.01 | 0.10 | 8 |

TABLE II

| | Gallium nitride crystal | | | Epi-wafer | |
|---|---|---|---|---|---|
| | Carrier conc. ($cm^{-3}$) | Disloc. dens. ($cm^{-2}$) | Cracking freq. (%) | Cracking freq. (%) | Device $\Delta V_{op}$ (V) |
| Embod. 1 | $2.2 \times 10^{18}$ | $6 \times 10^7$ | 7 | 15 | 0.031 |
| Embod. 2 | $3.0 \times 10^{18}$ | $6 \times 10^7$ | 6 | 12 | 0.029 |
| Embod. 3 | $3.5 \times 10^{18}$ | $6 \times 10^7$ | 6 | 8 | 0.028 |
| Embod. 4 | $4.5 \times 10^{18}$ | $6 \times 10^7$ | 6 | 8 | 0.029 |
| Embod. 5 | $2.2 \times 10^{18}$ | $6 \times 10^7$ | 7 | 14 | 0.036 |
| Embod. 6 | $3.0 \times 10^{18}$ | $6 \times 10^7$ | 6 | 10 | 0.035 |
| Embod. 7 | $3.5 \times 10^{18}$ | $6 \times 10^7$ | 5 | 8 | 0.033 |
| Embod. 8 | $4.7 \times 10^{18}$ | $6 \times 10^7$ | 6 | 7 | 0.028 |
| Embod. 9 | $3.0 \times 10^{18}$ | $6 \times 10^7$ | 6 | 9 | 0.034 |
| Embod. 10 | $3.0 \times 10^{18}$ | $6 \times 10^7$ | 7 | 9 | 0.026 |
| Embod. 11 | $3.0 \times 10^{18}$ | $6 \times 10^7$ | 7 | 9 | 0.027 |
| Embod. 12 | $3.3 \times 10^{18}$ | $6 \times 10^7$ | 6 | 8 | 0.031 |
| Embod. 13 | $4.2 \times 10^{18}$ | $6 \times 10^7$ | 5 | 7 | 0.031 |
| Embod. 14 | $4.3 \times 10^{18}$ | $6 \times 10^7$ | 5 | 8 | 0.025 |
| Embod. 15 | $4.1 \times 10^{18}$ | $6 \times 10^7$ | 6 | 8 | 0.034 |
| Comp. Ex. 1 | $9.0 \times 10^{17}$ | $6 \times 10^7$ | 53 | 80 | 0.082 |
| Comp. Ex. 2 | $1.2 \times 10^{18}$ | $6 \times 10^7$ | 45 | 70 | 0.071 |
| Comp. Ex. 3 | $1.5 \times 10^{18}$ | $6 \times 10^7$ | 41 | 42 | 0.065 |
| Ref. Ex. 1 | $3.0 \times 10^{18}$ | $6 \times 10^7$ | 4 | 7 | 0.028 |
| Ref. Ex. 2 | $3.0 \times 10^{18}$ | $6 \times 10^7$ | 4 | 7 | 0.028 |
| Ref. Ex. 3 | $3.0 \times 10^{18}$ | $6 \times 10^7$ | 4 | 7 | 0.028 |

Measurement Results

Figure 8:
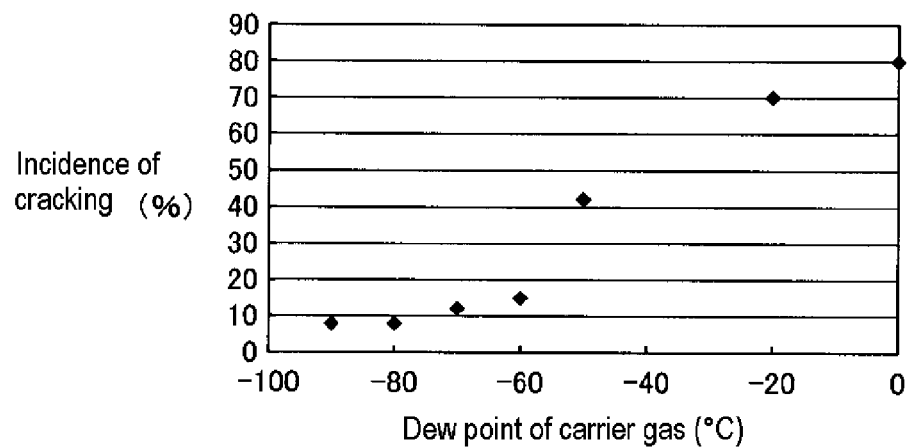
FIG. 8 is a graph showing relationship between carrier-gas dew point and incidence of cracking in the embodiments.

FIG. 8 is a graph showing relationship between dew point of carrier gas and incidence of cracking, in the present embodiments. As shown in FIG. 8 and Table II, in Embodiments 1 through 15 in which dew point is −60° C. or less, the incidence of cracking after the process for thickness reduction was carried out (Step S7) could be brought to 15% or less-that is, lower than in Comparative Examples 1 through 3. In particular, bringing the carrier-gas dew point to −80° C. or less enabled lowering the incidence of cracking in the gallium nitride crystals to 6% or less, and the incidence of cracking after the process for thickness reduction to 9% or less.

Figure 9:
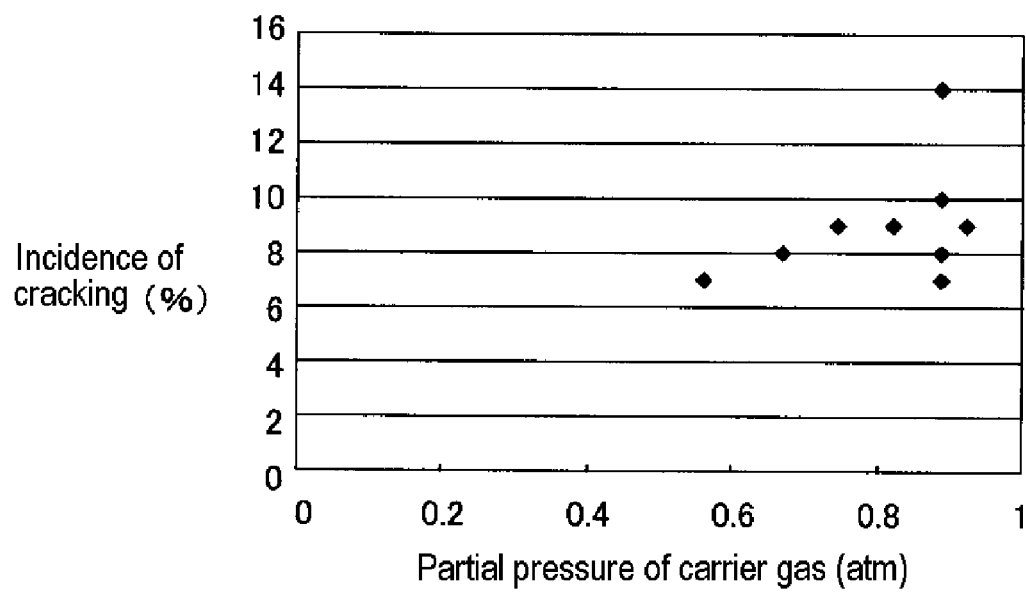
FIG. 9 is a graph showing relationship between carrier-gas partial pressure and incidence of cracking in the embodiments.

FIG. 9 is a graph showing relationship between carrier-gas partial pressure and incidence of cracking, in the present embodiments. As shown in FIG. 9 and Table II, bringing the carrier-gas partial pressure to 0.92 atm or less could lower the incidence of cracking in the gallium nitride crystals to 6%, and the incidence of cracking after the process for thickness reduction to 9%.

Figure 10:
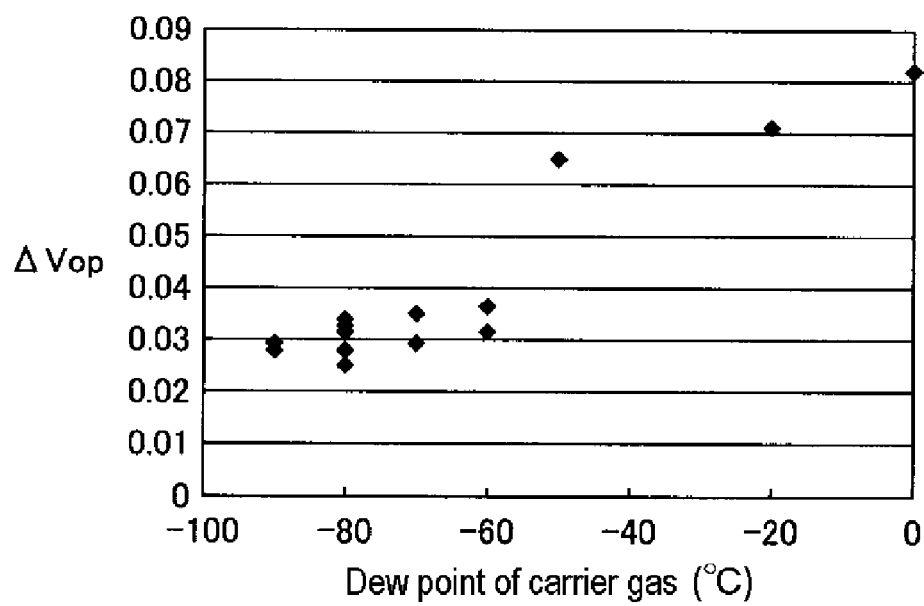
FIG. 10 is a graph showing relationship between carrier-gas dew point and extent to which operating voltage rises.

FIG. 10 is a graph showing relationship between carrier-gas dew point and extent to which operation voltage rose, in the present embodiments. As shown in FIG. 10 and Table II, in Embodiments 1 through 15 in which carrier-gas dew point was −60° C. or less, the extent to which operating voltage rose could be brought to 0.36 V or less-that is, lower than in Comparative Examples 1 through 3.

As shown in Table II, regardless of the carrier gas type, in Embodiments 1 through 15 in which carrier-gas dew point was brought to −60° C. or less, the incidence of cracking could be lowered.

Furthermore, in Embodiments 1 through 15, the gallium nitride crystals were grown by HVPE, which enabled increasing thickness.

Moreover, as shown in Table II, the carrier concentrations in Embodiments 1 through 15 were higher than those in Comparative Examples 1 through 3. Such results proved that the reaction of silicon into a silicon oxide was kept under control, and the silicon was incorporated as a carrier in the gallium nitride crystals. Furthermore, in Embodiments 1 through 15, low dislocation densities could be maintained.

Herein, in Reference Examples 1 through 3 presented in Table II, in the situation in which oxygen was utilized as a dopant, occurrence of cracking could be curbed, even if carrier-gas dew point was high, and furthermore, independently of temperature. These results made it evident that in the situation in which oxygen was utilized as a dopant, the oxygen was not incorporated as an impurity in the grown gallium nitride crystal, meaning that Reference Examples 1 through 3 did not involve the issue for the present invention of utilizing silicon as a dopant. It should be understood that the use of silicon as a dopant has an advantage in that the silicon is more likely to be incorporated in the c-face (the {0001} planes), compared with the use of oxygen.

The above results confirmed that according to the present embodiments, bringing carrier-gas dew point to −60° C. or less enables curbing cracking that occurred during a process for thickness reduction.

The presently disclosed embodiments and implementation examples should in all respects be considered to be illustrative and not limiting. The scope of the present invention is set forth not by the foregoing description but by the scope of the patent claims, and is intended to include meanings equivalent to the scope of the patent claims and all modifications within the scope.

Gallium nitride crystal obtained by the gallium nitride crystal growth method of the present invention makes it possible to curb cracking that occurs during a process for thickness reduction, and to grow gallium nitride having considerable thickness. Therefore, the gallium nitride crystal can be preferably employed in: light emitting devices, such as light emitting diodes and laser diodes; electron devices, such as rectifiers, bipolar transistors, field-effect transistors, and HEMTs; semiconductor sensors, such as temperature sensors, pressure sensors, radiation sensors, visible-blind ultraviolet detectors; and surface-acoustic-wave (SAW) devices, for example.

Only selected embodiments have been chosen to illustrate the present invention. To those skilled in the art, however, it will be apparent from the foregoing disclosure that various changes and modifications can be made herein without departing from the scope of the invention as defined in the appended claims. Furthermore, the foregoing description of the embodiments according to the present invention is provided for illustration only, and not for limiting the invention as defined by the appended claims and their equivalents.

What is claimed is:

1. A method of growing silicon-doped gallium nitride crystal by HVPE, the growth method comprising:
   (a) preparing carrier gasses for carrying gallium nitride precursors;
   (b) preparing a gas containing silicon as a dopant;
   (c) purifying the prepared carrier gasses so that the carrier gasses have a dew point of not greater than −60° C.;
   (d) preparing a gallium source and an undersubstrate suitable for gallium nitride growth and placing the gallium source and the undersubstrate within an HVPE reactor;
   (e) supplying the gallium nitride precursors via the carrier gasses, at a predetermined total partial pressure, into the HVPE reactor and thereby to the gallium source, supplying the doping gas into the HVPE reactor, and heating the HVPE reactor interior to vapor-phase epitaxially grow gallium nitride crystal onto the undersubstrate;
   (f) growing the gallium nitride crystal to a thickness of at least 200 µm; and
   (g) repeating (a) through (f) a plurality of times to yield a production run of silicon-doped gallium nitride crystals, wherein
   said total partial pressure of the carrier gasses is predetermined together with said carrier-gas dew point in such a way as to impart to the grown gallium nitride crystal a silicon dopant concentration of not less than $2.2 \times 10^{18}$ cm$^{-3}$ correlating to a cracking frequency of not greater than 7% in the production run, given that an occurrence of cracking is taken to be 30 or more crack lines of 100 µm or greater length appearing over the entirety of a 45.8 mm-diameter area of each of the crystals grown in the production run.

2. A gallium nitride crystal growth method as set forth in claim 1, wherein the partial pressure of the carrier gas during the gallium nitride crystal growth in (e) is between 0.56 atm and 0.92 atm inclusive.

3. An epi-wafer manufacturing method, comprising:
   the gallium nitride crystal growth method as set forth in claim 1;
   a step of removing at least the undersubstrate to form a substrate composed of gallium nitride crystal and therein having a silicon dopant concentration of not less than $2.2 \times 10^{18}$ cm$^{-3}$ and a thickness of at least 200 µm;
   a step of forming an epitaxially grown layer onto said substrate; and
   a step of processing for thickness reduction a surface of the substrate on the side opposite from that surface of the substrate onto which the epitaxially grown layer is formed.

4. An epi-wafer comprising:
   a substrate of the production run in (q) of the gallium nitride crystal growth method set forth in claim 1; and
   an epitaxially grown layer formed onto said substrate;
   the epi-wafer characterized in being mechanically thickness-reduced to a thickness of 100 µm.

5. A method of growing silicon-doped gallium nitride crystal by HVPE, the growth method comprising:
   (a) preparing carrier gasses for carrying gallium nitride precursors and for carrying a doping gas;
   (b) preparing as the doping gas a gas containing dopant silicon;
   (c) passing the prepared carrier gasses across a molecular film to purify them so that the carrier gasses have a dew point of not greater than −60° C.;
   (d) preparing a gallium source and an undersubstrate suitable for gallium nitride growth and placing the gallium source and the undersubstrate within an HVPE reactor;
   (e) via the carrier gasses supplying, at a predetermined total partial pressure, the gallium nitride precursors into the HVPE reactor, and thereby to the gallium source, and supplying the doping gas into the HVPE reactor, and heating the HVPE reactor interior to vapor-phase epitaxially grow gallium nitride crystal onto the undersubstrate;
   (f) growing the gallium nitride crystal to a thickness of at least 200 µm; and
   (g) repeating (a) through (f) a plurality of times to yield a production run of silicon-doped gallium nitride crystals, wherein
   said total partial pressure of the carrier gasses is predetermined together with said carrier-gas dew point in such a way as to impart to the grown gallium nitride crystal a silicon dopant concentration of not less than $2.2 \times 10^{18}$ cm$^{-3}$ correlating to a cracking frequency of not greater than 7% in the production run, given that an occurrence of cracking is taken to be 30 or more crack lines of 100 µm or greater length appearing over the entirety of a 45.8 mm-diameter area of each of the crystals grown in the production run.

6. A gallium nitride crystal growth method as set forth in claim 5, wherein the partial pressure of the carrier gas during the gallium nitride crystal growth in (e) is between 0.56 atm and 0.92 atm inclusive.

7. A silicon-doped gallium nitride crystal substrate of the gallium nitride crystal growth method set forth in claim 3, wherein the gallium nitride crystal has a thickness of at least 4 mm.

8. An epi-wafer manufacturing method as set forth in claim 3, wherein the crystal is grown onto the undersubstrate to a thickness of at least 4 mm.

* * * * *